United States Patent
Tsukikawa

(10) Patent No.: US 6,717,841 B2
(45) Date of Patent: Apr. 6, 2004

(54) SEMICONDUCTOR MEMORY DEVICE HAVING NONVOLATILE MEMORY CELL OF HIGH OPERATING STABILITY

(75) Inventor: Yasuhiko Tsukikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 34 days.

(21) Appl. No.: 10/226,211

(22) Filed: Aug. 23, 2002

(65) Prior Publication Data

US 2003/0161177 A1 Aug. 28, 2003

(30) Foreign Application Priority Data

Feb. 28, 2002 (JP) ........................................ 2002-052744

(51) Int. Cl.[7] ............................................... G11C 11/00
(52) U.S. Cl. ........................................................ 365/154
(58) Field of Search .......................................... 365/154

(56) References Cited

U.S. PATENT DOCUMENTS

| | | | |
|---|---|---|---|
| 5,475,638 A | * 12/1995 | Anami et al. | 365/189.11 |
| 5,870,331 A | * 2/1999 | Hwang et al. | 365/154 |
| 6,091,626 A | * 7/2000 | Madan | 365/154 |
| 6,104,663 A | * 8/2000 | Kablanian | 365/230.05 |
| 6,404,670 B2 | * 6/2002 | Shau | 365/154 |

* cited by examiner

*Primary Examiner*—Hoai Ho
(74) *Attorney, Agent, or Firm*—McDermott, Will & Emery

(57) ABSTRACT

There is provided with A flip-flop circuit for setting one of first and second storage nodes at one of first and second potential levels and the other storage node at the other potential level in accordance with stored data, and a switch circuit electrically coupling an internal node electrically coupled to a bit line to a first potential in accordance with the potential level of the one storage node.

12 Claims, 9 Drawing Sheets

US 6,717,841 B2

SEMICONDUCTOR MEMORY DEVICE HAVING NONVOLATILE MEMORY CELL OF HIGH OPERATING STABILITY

BACKGROUND OF THE INVENTION

1. Field of the Invention

The present invention relates to a semiconductor memory device, and more particularly to a configuration of a memory cell of a static random access memory (SRAM).

2. Description of the Background Art

Random access memories (RAMs) which are memory devices capable of arbitrarily writing, holding and reading data are mainly divided into a dynamic RAM (DRAM: Dynamic Random Access Memory) which requires a refresh operation to hold stored data and a static RAM (SRAM: Static Random Access Memory) which does not require a refresh operation.

SRAM is characterized in that although the structure thereof is more complicated than DRAM and cost per unit capacity is high than that of DRAM, high rate data read and write operations can be performed because of no need to perform a refresh operation. Due to this, SRAM is employed as, for example, a cache memory or the like which requires following up the rate of a high rate CPU (Central Processing Unit). Recently, in particular, SRAM is widely used for a portable terminal equipment or the like which operates by a battery with relatively low power consumption.

FIG. 5 is a circuit diagram showing one example of the configuration of an SRAM memory cell. In FIG. 5, a so-called CMOS (Complementary Metal Oxide Semiconductor) memory cell which consists of six MOS transistors is shown.

Referring to FIG. 5, pMOS transistors PT1 and PT2 and nMOS transistors NT1 and NT2 form two CMOS inverters to hold the signal levels of storage nodes N1 and N2 and a CMOS flip-flop circuit is constituted by cross-coupling the two CMOS inverters. To write and read data to and from storage nodes N1 and N2, access transistors NT3 and NT4 are turned on in response to the activation of a word line WL (to H level), whereby storage nodes N1 and N2 are electrically connected to bit lines BL and /BL, respectively.

If word line WL is deactivated (to L level) and access transistors NT3 and NT4 are turned off, either nMOS transistor or the pMOS transistor is turned on in each CMOS inverter in accordance with the level of the data stored in corresponding storage node N1 or N2. As a result, one of storage nodes N1 and N2 is connected to one of a power supply voltage VCC corresponding to the "H" level of the data and a ground voltage GND corresponding to the "L" level of the data and the other storage node is connected to the other voltage VCC or GND in accordance with the level of the data held in the memory cell. It is, therefore, possible to hold the data in the memory cell in a stand-by state without periodically turning on word line WL and executing a refresh operation.

FIG. 6 is a circuit diagram showing one example of another configuration of an SRAM memory cell. In FIG. 6, a so-called p-type TFT (Thin Film Transistor) load type memory cell which consists of four MOS transistors and two p-type thin film transistors PPT1 and PPT2 is shown. Thin film transistors PPT1 and PPT2 indicate transistors of a conductive type P each formed out of a polysilicon thin film.

Referring to FIG. 6, nMOS transistors NT1 and NT2 hold the signal levels of storage nodes N1 and N2, respectively.

Thin film transistors PPT1 and PPT2 are connected in parallel between power supply voltage VCC and storage node N1 and node N2, respectively. It is noted that nMOS transistors NT1 and NT2 will be also referred to as "driver transistors". Thin film transistors PPT1 and PPT2 and nMOS transistors NT1 and NT2 constitute a flip-flop circuit. To write and read data to and from storage nodes N1 and N2, access transistors NT3 and NT4 are turned on in response to the activation of word line WL (to H level), whereby storage nodes N1 and N2 are electrically connected to bit lines BL and /BL, respectively. The data write and read operations of the p-type TFT load SRAM memory cell are the same as those of the CMOS memory cell stated above. A multilayer structure can be adopted as the cell structure of this p-type TFT load SRAM memory cell. That is, it is possible to form thin film transistors PPT1 and PPT2 on a different layer from that of driver transistors NT1 and NT2 on a semiconductor substrate. Therefore, p-type TFT load SRAM memory cell has an advantage in that a cell area is small.

FIG. 7 is a circuit diagram showing one example of yet another configuration of an SRAM memory cell. In FIG. 7, a so-called high resistance load memory cell which consists of four MOS transistors and two high resistances R1 and R2 is shown.

Referring to FIG. 7, this high resistance load memory cell differs from the memory cell shown in FIG. 6 in that thin film transistors PPT1 and PPT2 are replaced by high resistances R1 and R2, respectively. It is noted that high resistances R1 and R2 and driver transistors NT1 and NT2 constitute a so-called high resistance load type flip-flop circuit. The other operations and the like of the high resistance load memory cell are the same as those of the CMOS memory cell stated above. A multilayer structure can be adopted as the cell structure of this high resistance load memory cell as in the case of the p-type TFT load memory cell. That is, it is possible to form high resistances R1 and R2 on a different layer from that of driver transistors NT1 and NT2 on a semiconductor substrate and to make the cell area small.

As one of the indicators for the operating stability of an SRAM memory cell, a static noise margin is employed.

FIG. 8 is a conceptual view showing the relationship of the static noise margin when the CMOS memory cell is in a stand-by state. As shown in FIG. 8, the input/output characteristic of the CMOS memory cell is indicated by the characteristic view of two cross-coupled inverters.

In case of FIG. 8, the characteristic curve k1 of one CMOS inverter is given. By inverting characteristic curve k1 symmetrically about a line, indicated by a dotted line in FIG. 8, having 45 degrees with respect to vertical and horizontal axes, a characteristic curve k2 is obtained. This characteristic curve k2 corresponds to the characteristic curve of the other CMOS inverter cross-coupled to one CMOS inverter stated above. A combination of characteristic curves k1 and k2 corresponds to the input/output characteristic view of the CMOS memory cell. In this case, as shown in FIG. 8, a region surrounded by curves k1 and k2 and normally referred to as "cell's eye" is formed. The maximum distance L1 between curves k1 and k2 in the region corresponds to a static noise margin. It is indicated that if the distance is larger, the input/output characteristic of the CMOS memory cell is more stable.

Points S1 and S2 shown in FIG. 8 are stable points. Stable point S1 corresponds to a state in which data "0" is stored. Stable point S2 corresponds to a state in which data "1" is stored. In addition, a point S3 is a metastable point. Even if the operation of the CMOS memory cell corresponds to point S3 in an initial state, it never fails to be moved to either point S1 or S2 whenever microscopic noise occurs and is stabilized at the moved point.

On the other hand, the input/output characteristic view of the CMOS memory cell when data is read from the cell changes as shown in FIG. 9. As already stated above, when data is read from the memory cell, access transistors NT3 and NT4 are both turned on and storage nodes N1 and N2 are electrically connected to bit lines BL and /BL, respectively. As a result, the so-called cell's eye, i.e., the static noise margin becomes very narrow during data read as shown in FIG. 9. If the so-called cell's eye disappears, it is difficult to hold the data.

It is said that the area of above-stated p type TFT load memory cell can be made smaller than that of the CMOS memory cell, which area is about eight times as large as that of a DRAM memory cell if manufactured under the same design standard (design rule). This is because the p type thin film transistors can be formed on a layer above the nMOS transistors. However, the ratio of an ON current to an OFF current driven by the driver transistors is far lower than that of the CMOS memory cell. For example, while the ratio of the ON current and the OFF current of the p-type TFT load memory cell is several hundreds and that the ratio of the CMOS memory cell is not less than several hundred thousands. Due to this, the static noise margin of the p-type TFT load memory cell is narrower than that of the CMOS memory cell in a stand-by state. Further, if the memory cell is made smaller in size, the ratio of the ON current and the OFF current becomes lower. Besides, if the power supply voltage is lower, the ratio becomes lower, as well. As a result, it is difficult to secure this static noise margin particularly when data is read from the memory cell.

In addition, the area of the high resistance load memory cell can be made smaller than that of the CMOS memory cell since the high resistances can be formed on a layer above the nMOS transistors as in the case of the p-type TFT load memory cell. However, because of the arrangement of the high resistances (passive elements) between the storage nodes and the power supply voltage, respectively, a stand-by current is always penetrated into one of the storage nodes by the driver transistors. The high resistance load memory cell has, therefore, a disadvantage in that a stand-by current is high on an entire chip. Furthermore, the static noise margin of the high resistance load memory cell is narrower than that of the CMOS memory cell in a stand-by state.

Accordingly, various memories have both advantages and disadvantages. At present, therefore, CMOS memory cells having a relatively wide static noise margin are normally employed.

Nevertheless, since the configuration of the CMOS memory cell is such that six transistors are formed on a semiconductor substrate and both an N well and a P well are provided as well structures for forming the transistors in one memory cell, the area of one memory cell is very large. It is normally said that such a CMOS memory cell has an area about twelfth times as large as that of a DRAM memory cell if manufactured under the same design standard (design rule).

Furthermore, a relatively wide static noise margin can be secured for this CMOS memory cell, compared with those of the p-type TFT load memory cell and the high resistance load memory cell in a stand-by state. However, during data read, even the static noise margin of the CMOS memory cell becomes narrow as shown in FIG. 9. It is noted that the static noise margins of the other p-type TFT load memory cell and high resistance load memory cell become far narrower than that of the CMOS memory cell.

SUMMARY OF THE INVENTION

It is an object of the present invention to provide a semiconductor memory device having memory cells each of which has a relatively small area and which has high operating stability.

In short, the present invention provides a semiconductor memory device which includes a plurality of memory cells, a plurality of word lines, a plurality of bit lines and a plurality of write select lines.

A plurality of memory cells are arranged in a matrix. A plurality of word lines are provided to correspond to memory cell rows, respectively, and selectively activated in accordance with a row select result. A plurality of bit lines are provided to correspond to memory cell columns, and transmitting data, respectively. A plurality of write select lines are provided to correspond to the memory cell columns, respectively, and selectively activated during data write. In addition, each of the plurality of memory cells includes a flip-flop circuit and first to third switch circuits. The flip-flop circuit sets one storage node of first and second storage nodes at one voltage of first and second voltages and the other storage node at the other voltage in accordance with the stored data. The first switch circuit electrically couples the corresponding bit line to an internal node in accordance with activation of the word line corresponding to the selected memory cell during data read and the data write. The second switch circuit electrically couples a predetermined one storage node of the first and second storage node to the internal node in accordance with the activation of the write select line corresponding to the selected memory cell during the data write. The third switch circuit electrically couples the internal node to the first voltage in accordance with a voltage level of the predetermined one storage node during the data read.

Therefore, a main advantage of the present invention is in that during data read, the internal node is electrically coupled to the first voltage in accordance with a predetermined one of the first and second storage node and the voltage of this internal node is transmitted to the corresponding bit line. That is, since the data read can be executed without electrically coupling the bit line to the storage node, it is possible to secure the static noise margin of a memory cell during the data read and to execute a stable read operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter in detail with reference to the drawings. It is noted that same or corresponding sections are denoted by the same reference symbols, respectively and will not be repeatedly described.

(First Embodiment)

Figure 1:
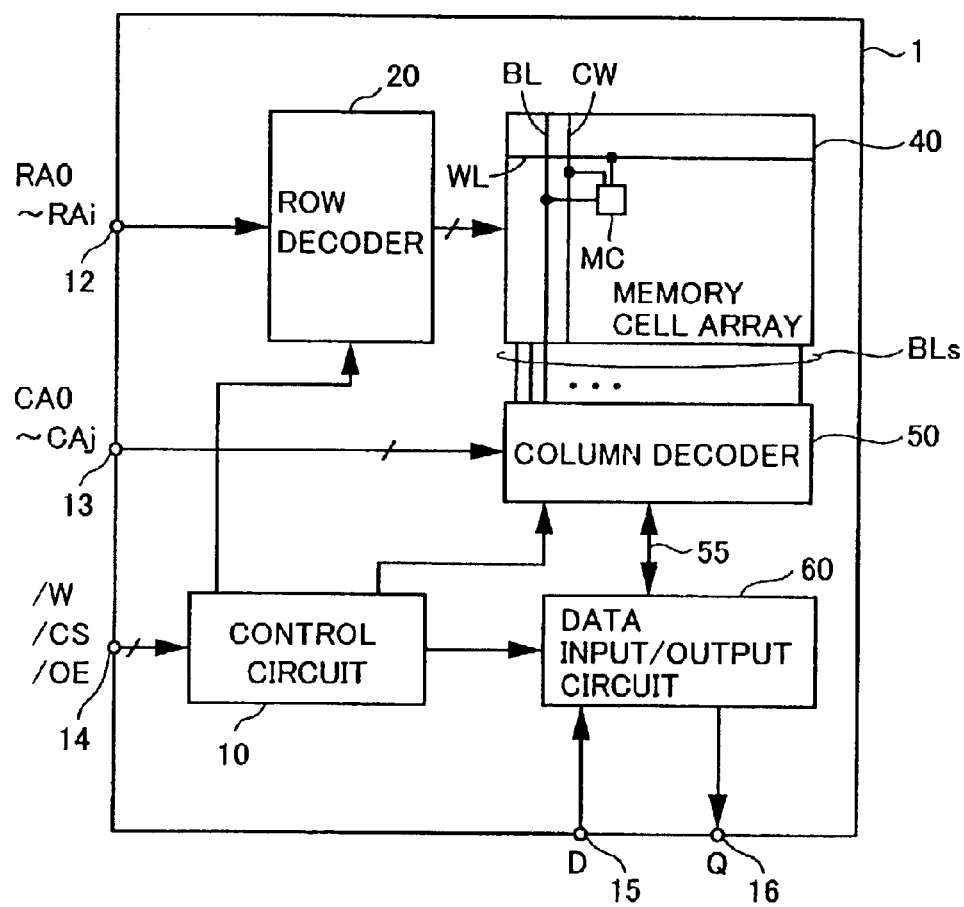
FIG. 1 is a schematic block diagram showing the configuration of a semiconductor memory device 1 according to the first embodiment of the present invention.

Semiconductor memory device 1 shown in FIG. 1 is a static memory device, represented by SRAM, capable of holding stored data without executing a refresh operation.

Referring to FIG. 1, semiconductor memory device 1 includes a row address terminal 12 which receives row address signals RA0 to RAi (where i is a natural number), a column address terminal 13 which receives column address signals CA0 to CAj (where j is a natural number), a control signal terminal 14 which receives control signals such as a read/write control signal /W, a chip select signal /CS and an output enable signal /OE, a data input terminal 15 which receives input data D, and a data output terminal 16 which outputs output data Q.

Semiconductor memory device 1 also includes a control circuit 10 which controls the internal operation of semiconductor memory device 1 in response to the control signals, a memory cell array 40 which includes a plurality of memory cells arranged in a matrix, a row decoder 20 which decodes row address signals RA0 to RAi and executes the selection of a memory cell row, a column decoder 50 which decodes column address signals CA0 to CAj and executes the selection of a memory cell column, and a data input/output circuit 60 which executes the transmission and receiving of data to and from a data I/O line 55, data input terminal 15 and data output terminal 16. In addition, column decoder 50 includes a row select circuit which connects one of a plurality of bit lines BLs provided to correspond to the memory cell rows, respectively, to data I/O line 55, and the like.

Data input/output circuit 60 includes a write driver which writes input data D to memory cell array 40 through data I/O line 55, an amplifier circuit which amplifies the read data transmitted to data I/O line 55, and the like.

In memory cell array 40, one word line WL provided to correspond to a memory cell row, one bit line BL and one write select line CW provided to correspond to a memory cell column, and one corresponding memory cell MC are typically shown.

Figure 2:
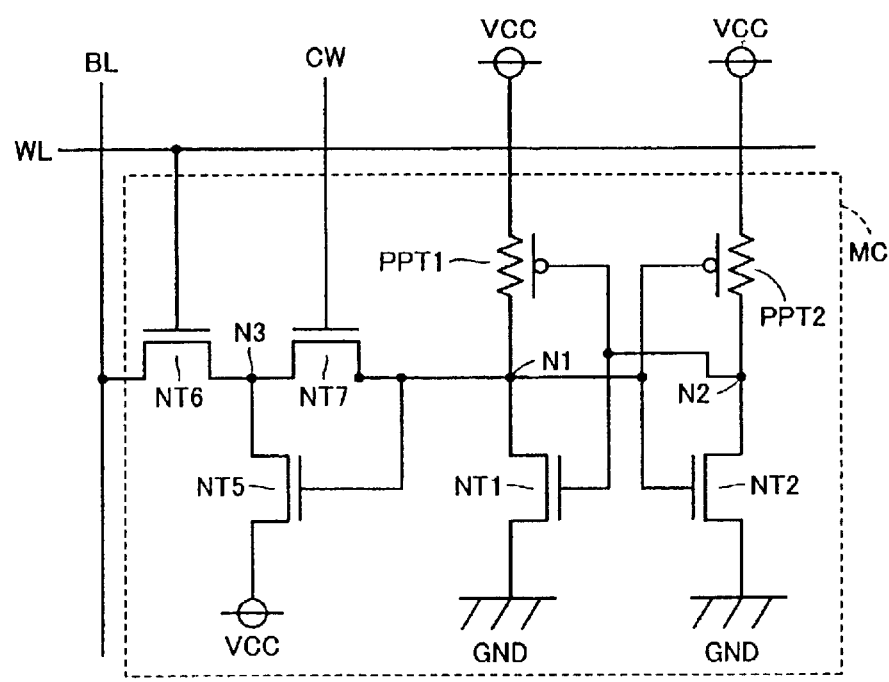
FIG. 2 is a circuit diagram showing an SRAM memory cell MC according to the first embodiment of the present invention.

Referring to FIG. 2, memory cell MC includes nMOS transistors NT1, NT2 and NT5 to NT7, and thin film transistors PPT1 and PPT2. In this embodiment, memory cell MC which includes a so-called p-type TFT load flip-flop circuit which consists of thin film transistors PPT1 and PPT2 and nMOS transistors NT1 and NT2, will be described by way of example.

Storage nodes N1 and N2 are connected to power supply voltage VCC through thin film transistors PPT1 and PPT2, respectively. NMOS transistors NT1 and NT2 referred to as driver transistors are electrically connected between storage node N1 and ground voltage GND and between storage node N2 and ground voltage GND, respectively. NMOS transistor NT6 is connected between bit line BL and a node N3 (also referred to as "internal node") and the gate thereof is connected to corresponding word line WL. NMOS transistor NT5 is connected between a node N3 and power supply voltage VCC and the gate thereof is connected to storage node N1. Namely, nMOS transistor NT5 electrically connects or disconnects node N3 to/from power supply voltage VCC in accordance with the voltage level of storage node N1. NMOS transistor NT7 is arranged between node N3 and storage node N1 and the gate thereof is connected to write select line CW. Namely, nMOS transistor NT7 electrically connects or disconnects internal node N3 to/from corresponding bit line BL in accordance with the voltage level of corresponding write select line CW.

In the flip-flop circuit formed in the p-type TFT load memory cell, one of nMOS transistor NT1 and p-type thin film transistor PPT1 and one of nMOS transistor NT2 and p-type thin film transistor PP2 are turned on in accordance with the level of data held by storage nodes N1 and N2, respectively. As a result, one of storage nodes N1 and N2 is electrically connected to one of power supply voltage VCC and ground voltage GND and the other storage node is electrically connected to the other voltage VCC or GND in accordance with the level of data held in the memory cell. Therefore, even in a stand-by state, the potential levels of storage nodes N1 and N2 are maintained.

Figure 3:
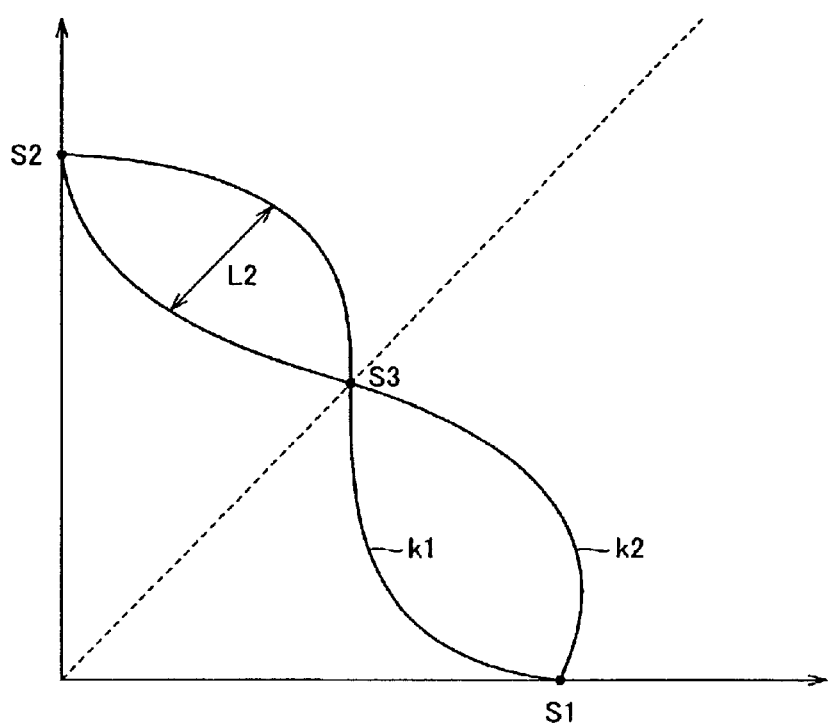
FIG. 3 is an input/output characteristic view when SRAM memory cell in the first embodiment is in a stand-by state.
Figure 8:
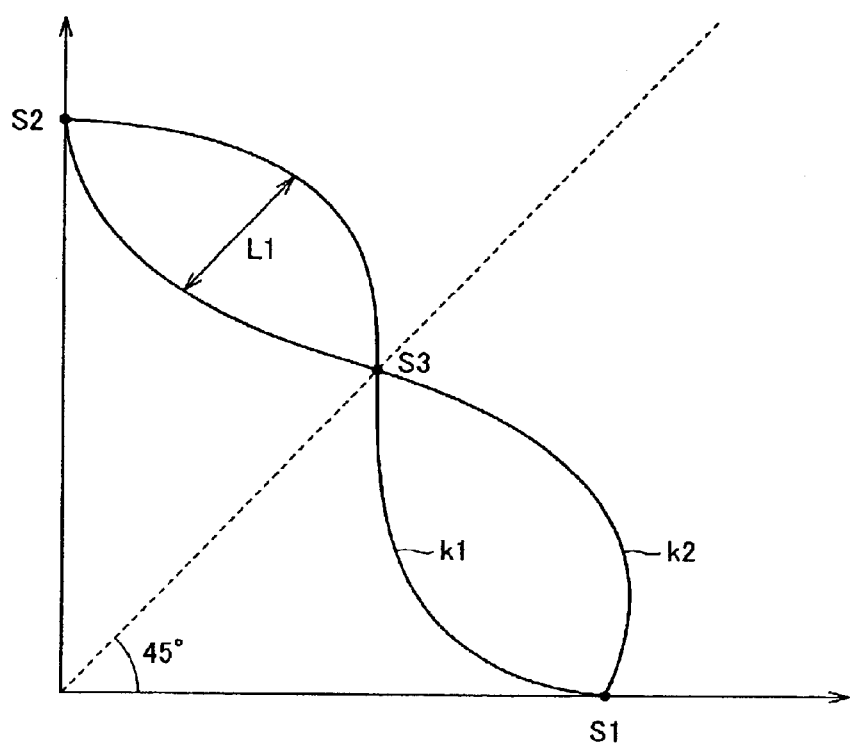
FIG. 8 is a conceptual view showing the relationship of a static noise margin when a CMOS memory cell is in a stand-by state.
Figure 9:
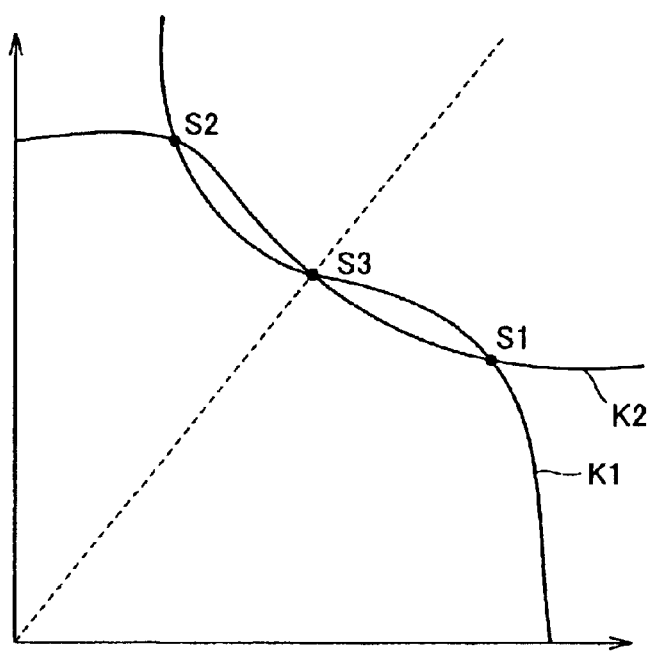
FIG. 9 is an input/output characteristic view when data is read from the CMOS memory cell.

As shown in FIG. 3, the maximum distance L2 between characteristic curves k1 and k2 as the static noise margin of the memory cell in a standby state is shown. Since the static noise margin in the stand-by state depends on the configuration of the flip-flop circuit stated above, maximum distance L2 which corresponds to the static noise margin of the memory cell of semiconductor memory device 1 is smaller than maximum distance L1 of the conventional CMOS memory cell shown in FIG. 8.

Next, a data read operation for reading data from memory cell MC will be described.

Referring back to FIG. 2, when data is read from memory cell MC, row decoder 20 activates selected word line WL to "H" level and deactivates unselected word lines to "L" level. Column decoder 50 selects bit line BL electrically connected to data I/O line 55. During data read, each write select line CW is deactivated to "L" level.

If word line WL is activated in the selected memory cell, accordingly, nMOS transistor NT6 is turned on to thereby electrically connect internal node N3 to corresponding bit line BL. At this moment, since write select line CW is at "L" level, nMOS transistor NT7 is turned off to thereby disconnect storage node N1 from N3. If storage node N1 is at "H" level and storage node N2 is at "L" level, then nMOS transistor NT5 is turned on. If so, power supply voltage VCC is electrically connected to internal node N3 and a current is supplied to bit line BL through transistors NT5 and NT6.

On the other hand, if storage node N1 is at "L" level and storage node N2 is at "H" level, then nMOS transistor NT5 is turned off and no current is, therefore, supplied to bit line BL.

Therefore, by precharging bit line BL with a predetermined potential and detecting the presence/absence of a current carried to bit line BL, it is possible to read data stored in the selected memory cell. For example, during data read, bit line BL is precharged with ground voltage GND ("L" level). When the potential level of storage node N1 is at "H" level, nMOS transistor NT5 is turned on. In addition, internal node N3 and bit line BL are electrically connected to each other in accordance with the activation of word line WL (to "H" level). As a result, a current is carried to bit line BL based on the potential difference between power supply voltage VCC and ground voltage GND. In response to the flow of the current in bit line BL, a sense amplifier circuit or the like can detect a data signal at "H" or "L" level.

Alternatively, bit line BL may be precharged with predetermined potential between power supply voltage VCC and ground voltage GND. In this case, as in the case of the above, by detecting a current based on the potential difference between power supply voltage VCC and the intermediate predetermined potential, the sense amplifier circuit or the like can detect a data signal at "H" or "L" level.

A data write operation for writing data to memory cell MC will next be described.

Row decoder 20 activates word line WL which is selected similarly to the data read operation, to "H" level and deactivates unselected word line WLs to "L" level. In addition, column decoder 50 selects bit line BL to be electrically connected to data I/O line 55 and transmits written data to bit line BL corresponding to selected memory cell MC. Further, write select line CW corresponding to selected memory cell MC is selectively activated to "H" level and each of unselected write select lines CWs is deactivated to "L" level.

Accordingly, nMOS transistor NT6 in selected memory cell MC is turned on and internal node N3 is electrically connected to bit line BL. In addition, since write select line CW corresponding to selected memory cell is activated to "H" level, internal node N3 is electrically connected to storage node N1. As a result, bit line BL and storage node N1 are electrically connected to each other through transistors NT6 and NT7. Following this, it is possible to write the written data from bit line BL to selected memory cell. If "H"-level data is written to storage node N1, nMOS transistor NT5 is also turned on. However, since power supply voltage VCC ("H" level) is supplied to internal node N3, the potential level of storage node N1 is not erroneously changed.

The data read and write operations have been described above. By adopting the configuration according to the first embodiment, nMOS transistor NT7 is turned off during data read and storage node N1 is not, therefore, electrically connected to bit line BL. In other words, during data read, the potentials held by storage nodes N1 and N2 are not changed by the electrically connecting node N1 to bit line BL.

Therefore, the input/output characteristic of this memory cell MC during data read is equal to that in a stand-by state shown in FIG. 3. Due to this, by adopting the configuration according to the first embodiment, it is possible to secure a wider static noise margin than that of the CMOS memory cell when data is read from the CMOS memory cell.

Further, according to the present configuration, the p-type thin film transistors can be formed on the different layer from that of the nMOS transistors as already described above. The size of a memory cell is determined by the occupied area of the nMOS transistors. If the SRAM memory cell consisting of five nMOS transistors is used, it is possible to make the cell area smaller than that of the conventional CMOS memory cell.

Accordingly, by adopting the SRAM memory cell of the present invention, it is possible to ensure the operating stability of the memory cell and to decrease the cell area. As a consequence, it is possible to apply the SRAM memory cells of the present invention to a large capacity memory array.

Furthermore, by adopting the configuration according to the first embodiment, it is possible to secure an equal high rate to that of the conventional CMOS memory cell, to miniaturize a transistor element and to deal with the reduction of the power supply voltage.

Moreover, by increasing the channel widths of nMOS transistors NT4 to NT6 described with reference to FIG. 1, data access can be accelerated.

The configuration which includes the p-type TFT load flip-flop circuit has been described above as one example of the configuration of the memory cell. Alternatively, if a configuration using a high resistance load flip-flop circuit is adopted, the same advantages can be obtained. It is further possible to adopt a configuration using a CMOS flip-flop circuit. Even with the latter configurations, when data is read from a memory cell, nMOS transistor NT7 is turned off and a current is not carried into or from storage node N1 in the memory cell. Therefore, irrespectively of the configuration of the flip-flop circuit, the static noise margin of the memory cell during data read does not become narrower than that in a stand-by state.

Further, the configuration in which storage node N1 is connected to the gate of nMOS transistor NT5, nMOS transistor NT7 is provided between internal node N3 and storage node N1, and internal node N3 is electrically connected to storage node N1 in accordance with the activation of write select line CW, has been described above. Alternatively, a configuration in which storage node N2 is connected to the gate of nMOS transistor NT5, nMOS transistor N7 is provided between internal node N3 and storage node N2 and internal node N3 is electrically connected to storage node N2 in accordance with the activation of write select line CW.

(Second Embodiment)

Figure 4:
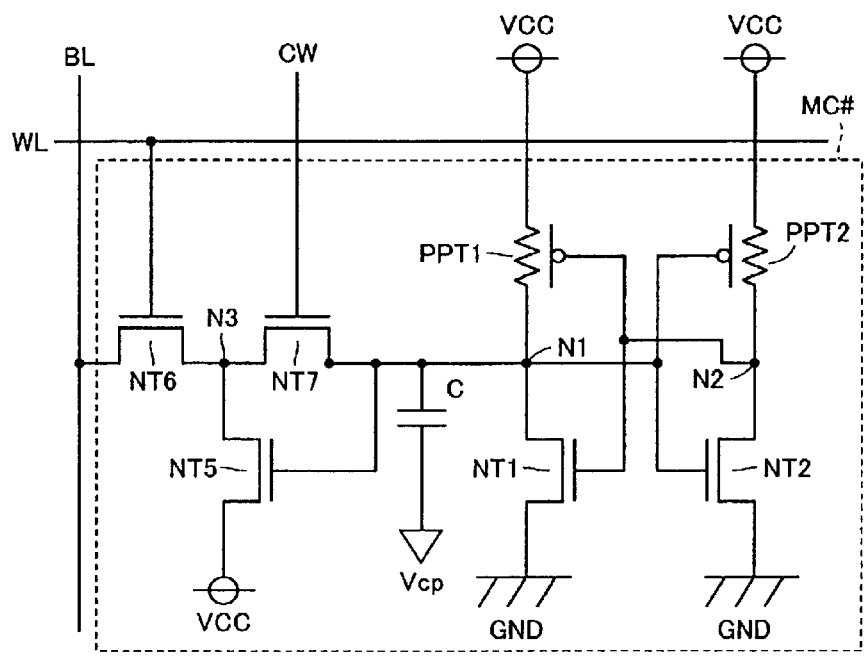
FIG. 4 is a block diagram of a memory cell MC# according to the second embodiment of the present invention.
Figure 5:
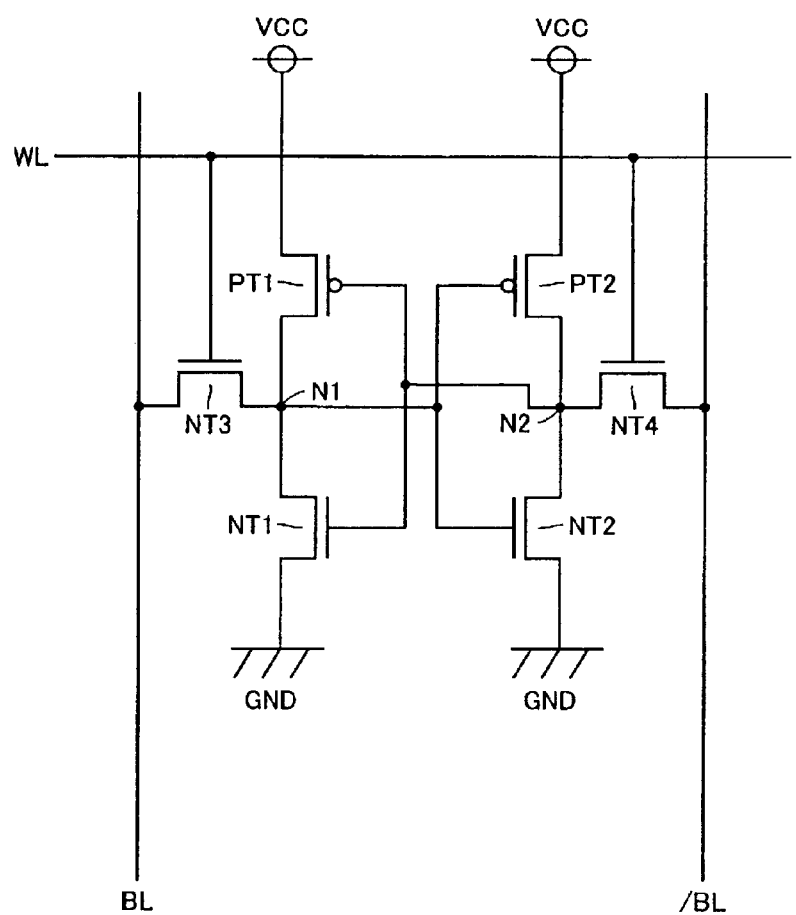
FIG. 5 is a circuit diagram showing one example of the configuration of an SRAM memory cell.
Figure 6:
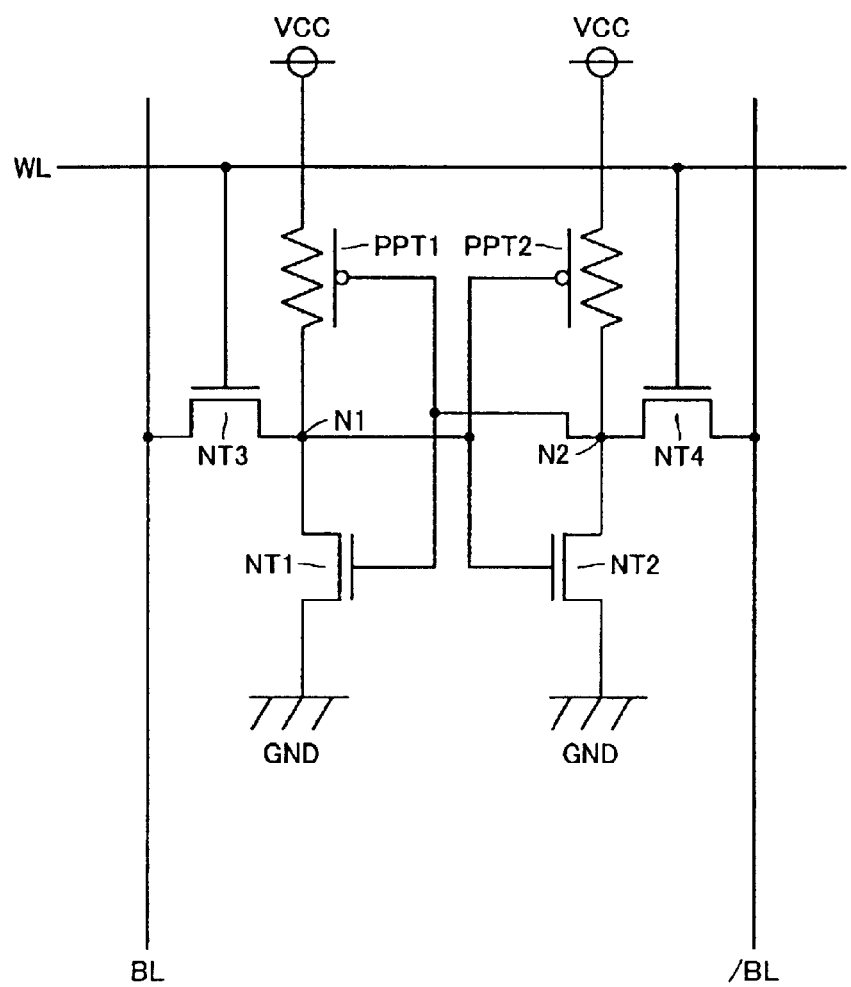
FIG. 6 is a circuit diagram showing one example of another configuration of an SRAM memory cell.
Figure 7:
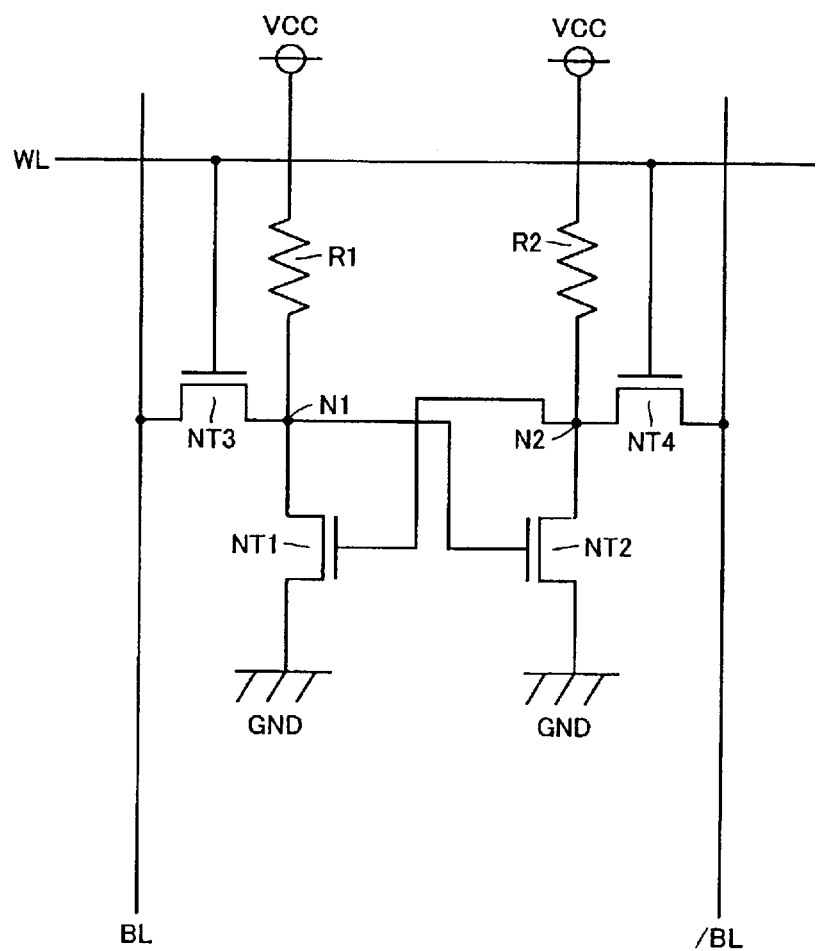
FIG. 7 is a circuit diagram showing one example of yet another configuration of an SRAM memory cell.

Referring to FIG. 4, memory cell MC# differs from memory cell MC shown in FIG. 2 in that a capacitor C is further provided. Capacitor C is connected between storage node N1 and a predetermined voltage Vcp. Predetermined voltage Vcp is set at, for example, ground voltage GND, power supply voltage VCC, a power supply voltage ½VCC or the like.

Generally, the magnitude of the level of data read from a memory cell to bit line BL is proportional to a signal charge quantity which the storage node holds. In addition, a package material and a wiring material in a chip contain quite small quantities of radioactive elements such as uranium and thorium to the same degree as that of the nature. If $\alpha$ rays emitted from these elements are incident on the memory cell, the incident $\alpha$ rays influence the signal charge quantity of the memory cell. As a result, a so-called soft error that the stored data is inverted from "H" level to "L" level by the extraction of charges, sometimes occurs.

However, by connecting capacitor C to storage node N1 as shown in the configuration according to the second embodiment, the extracted charges are supplemented, making it possible to keep the stored data to be at "H" level and to enhance soft error resistance.

While the configuration of connecting capacitor C to storage node N1 is shown as an example in FIG. 4, the present invention is not limited to this configuration. It is also possible to connect capacitor C to storage node N2. It is also possible to provide capacitors Cs to correspond to storage nodes N1 and N2, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory cells arranged in a matrix;
    a plurality of word lines provided to correspond to memory cell rows, respectively, and selectively activated in accordance with a row select result;
    a plurality of bit lines provided to correspond to memory cell columns, and transmitting data, respectively; and
    a plurality of write select lines provided to correspond to said memory cell columns, respectively, and selectively activated in accordance with a column select result during data write, wherein
        each of said memory cells includes:
            a flip-flop circuit for setting one storage node of first and second storage nodes at one voltage of first and second voltages and the other storage node at the other voltage in accordance with a stored data;
            a first switch circuit electrically coupling corresponding said bit line to an internal node in accordance with activation of corresponding said word line during data read and said data write;
            a second switch circuit electrically coupling a predetermined one storage node of said first and second storage node to said internal node in accordance with the activation of corresponding said write select line during said data write; and
            a third switch circuit electrically coupling said internal node to said first voltage in accordance with a voltage level of said predetermined one storage node during said data read.

2. The semiconductor memory device according to claim 1, wherein
    said flip-flop circuit includes:
        a first field effect transistor of a first conductive type, electrically coupled between said first voltage and said first storage node, and having a gate electrically coupled to said second storage node;
        a second field effect transistor of a second conductive type, opposite to said first conductive type, electrically coupled between said second voltage and said first storage node, and having a gate electrically coupled to said second storage node;
        a third field effect transistor of said first conductive type, electrically coupled between said first voltage and said second storage node, and having a gate electrically coupled to said first storage node; and
        a fourth field effect transistor of said second conductive type, electrically coupled between said second voltage and said second storage node, and having a gate electrically coupled to said first storage node.

3. The semiconductor memory device according to claim 1, wherein
    said flip-flop circuit includes:
        a first thin film field effect transistor of a first conductive type, electrically coupled between said first voltage and said first storage node, and having a gate electrically coupled to said second storage node;
        a first field effect transistor of a second conductive type opposite to said first conductive type, electrically coupled between said second voltage and said first storage node, and having a gate electrically coupled to said second storage node;
        a second thin film field effect transistor of said first conductive type, electrically coupled between said first voltage and said second storage node, and having a gate electrically coupled to said first storage node; and
        a second field effect transistor of said second conductive type, electrically coupled between said second voltage and said second storage node, and having a gate electrically coupled to said first storage node, and
        said first and second field effect transistors are formed on a first layer on a semiconductor substrate, and said first and second thin film field effect transistors are formed on a second layer different from said first layer on said semiconductor substrate.

4. The semiconductor memory device according to claim 1, wherein
    said flip-flop circuit includes:
        a first resistance element electrically coupled between said first voltage and said first storage node;
        a first field effect transistor, electrically coupled between said second voltage and said first storage node, and having a gate electrically coupled to said second storage node;
        a second resistance element electrically coupled between said first voltage and said second storage node; and
        a second field effect transistor equal in conductive type to said first field effect transistor, electrically coupled between said second voltage and said second storage node, and having a gate electrically coupled to said first storage node, and
        said first and second field effect transistors are formed on a first layer on a semiconductor substrate, and said first and second resistance elements are formed on a second layer different from said first layer on said semiconductor substrate.

5. The semiconductor memory device according to claim 1, wherein
    each of said bit lines to a predetermined voltage level before said data read.

6. The semiconductor memory device according to claim 5, wherein
    said predetermined voltage level corresponds to level of said second voltage lower than the level of said first voltage.

7. The semiconductor memory device according to claim 5, wherein
    said predetermined voltage level corresponds to a third voltage level between the level of said first voltage and the level of said second voltage.

8. The semiconductor memory device according to claim 1, wherein
    said first voltage is higher than said second voltage, and
    during said data read and said data write, said word line corresponding to the selected memory cell is electrically coupled to said first voltage.

9. The semiconductor memory device according to claim 1, wherein
said word line corresponding to the selected memory cell is electrically coupled to a third voltage during said data read and said data write, and
said third voltage is higher than said first and second voltages.

10. The semiconductor memory device according to claim 1, wherein
said first voltage is higher than said second voltage, and
during said data write, said write select line corresponding to the selected memory cell is electrically connected to said first voltage.

11. The semiconductor memory device according to claim 1, wherein
said write select line corresponding to the selected memory cell is electrically connected to a third voltage during said data write, and
said third voltage is higher than said first and second voltages.

12. The semiconductor memory device according to claim 1, wherein
each of said memory cells further includes:
a capacitor provided to correspond to at least one of said first and second storage nodes, and accumulating charges in accordance with a voltage of corresponding said storage node.

* * * * *